(12) United States Patent
Ramiro Rebollo et al.

(10) Patent No.: US 11,055,207 B2
(45) Date of Patent: Jul. 6, 2021

(54) AUTOMATIC GENERATION OF INTEGRATION TESTS FROM UNIT TESTS

(71) Applicant: The Boeing Company, Chicago, IL (US)

(72) Inventors: Daniel Ramiro Rebollo, Madrid (ES); Johan De Prins, Molenstede (BE); Maxim Constantijn Vos, Madrid (ES); Pawel Kajak, Gdansk (PL); Victor Arcos Barraquero, Madrid (ES); Bastian Figlar, Munich (DE)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/415,534

(22) Filed: May 17, 2019

(65) Prior Publication Data

US 2020/0327042 A1    Oct. 15, 2020

(30) Foreign Application Priority Data

Apr. 10, 2019   (EP) .................................. 19382265

(51) Int. Cl.
| | |
|---|---|
| *G06F 9/44* | (2018.01) |
| *G06F 11/36* | (2006.01) |
| *G06F 11/34* | (2006.01) |
| *G06F 30/33* | (2020.01) |

(52) U.S. Cl.
CPC ........ *G06F 11/3684* (2013.01); *G06F 11/348* (2013.01); *G06F 11/3688* (2013.01); *G06F 11/3692* (2013.01); *G06F 30/33* (2020.01)

(58) Field of Classification Search
IPC .............. G06F 11/3684,11/3688, 11/3692, 8/35
See application file for complete search history.

(56) References Cited

U.S. PATENT DOCUMENTS

| | | | | |
|---|---|---|---|---|
| 5,652,835 | A   * | 7/1997 | Miller ................. | G06F 11/3684 706/55 |
| 6,182,258 | B1 * | 1/2001 | Hollander ............... | G06F 30/33 714/739 |

(Continued)

OTHER PUBLICATIONS

Konstantin Rubinov, Generating Integration Test Cases Automatically, 4 pages (Year: 2010).*

(Continued)

*Primary Examiner* — Lewis A Bullock, Jr.
*Assistant Examiner* — Tina Huynh
(74) *Attorney, Agent, or Firm* — Sage Patent Group

(57) ABSTRACT

A method for automatic generation of integration tests from unit tests includes automatically running, by a processor, a unit test for each model of a plurality of models making-up a system. The method also includes automatically determining, by the processor, integration of unit test cases of interfacing models for one or more groups of interfacing models of the plurality of models. The method additionally includes automatically running, by the processor, an integration test for each group of interfacing models using the unit tests for each model of the interfacing models. The method further includes automatically detecting, by the processor, at least one of inconsistent, incomplete or incorrect data transmitted between the interfacing models for each group of interfacing models.

20 Claims, 11 Drawing Sheets

(56) References Cited

U.S. PATENT DOCUMENTS

| | | | |
|---|---|---|---|
| 2006/0242525 A1* | 10/2006 | Hollander | G06F 30/33 714/742 |
| 2008/0209369 A1* | 8/2008 | Sugihara | G01R 31/318357 716/106 |
| 2008/0270954 A1* | 10/2008 | Habib | G06F 30/30 716/106 |
| 2009/0172647 A1* | 7/2009 | Telang | G06F 11/3664 717/135 |
| 2011/0083121 A1* | 4/2011 | Dixit | G06F 11/3684 717/124 |
| 2011/0125448 A1* | 5/2011 | Jung | G06F 11/3684 702/108 |
| 2013/0042222 A1* | 2/2013 | Maddela | G06F 11/3684 717/124 |
| 2016/0062861 A1* | 3/2016 | Tegethoff | G06F 11/261 714/28 |
| 2018/0196739 A1 | 7/2018 | Li et al. | |

OTHER PUBLICATIONS

Pezze et al., Generating Effective Integration Test Cases from Unit Ones, 10 pages (Year: 2013).*
Extended European Search Report dated Oct. 17, 2019 for European Patent Application No. 19382265.7, 10 pages.

* cited by examiner

AUTOMATIC GENERATION OF INTEGRATION TESTS FROM UNIT TESTS

CROSSREFERENCE TO RELATED APPLICATIONS

The present application claims benefit of priority to European Patent Application No. 19382265.7, filed Apr. 10, 2019, and assigned to the same assignee as the present application and is incorporated herein by reference.

FIELD

The present disclosure relates to model-based development of a system and more particularly to automatic generation of integration tests from unit tests during model-based development of a system.

BACKGROUND

During the Model-Based Development (MBD) of a system, different entities of the system are modelled as separate model units. The model units integrated together model the complete system. The current procedure is to create model unit tests and integration tests as separate and independent activities. This disconnection causes inefficiencies and work repetition, as well as delaying the feedback on both the development of documentation and the model implementation of the system. Additionally, this work is not automated, as there is no tool that links the individual model unit tests and integrates them into a higher-level integration test case for the functionality they represent.

SUMMARY

In accordance with an embodiment, a method for automatic generation of integration tests from unit tests includes automatically running, by a processor, a unit test for each model of a plurality of models making-up a system. The method also includes automatically running, by the processor, an integration test for each group of interfacing models of the plurality of models using the unit tests for each model of the interfacing models. The method further includes automatically detecting, by the processor, at least one of inconsistent, incomplete and incorrect data transmitted between the interfacing models for each group of interfacing models.

In accordance with another embodiment, a system for automatic generation of integration tests from unit tests includes a processor circuit and a memory associated with the processor circuit. The memory includes computer readable program instructions that, when executed by the processor circuit cause the processor circuit to perform a set of functions including automatically running a unit test for each model of a plurality of models making-up a system. The set of functions also include automatically running an integration test for each group of interfacing models of the plurality of models using the unit tests for each model of the interfacing models. The set of functions also include automatically detecting at least one of inconsistent, incomplete and incorrect data transmitted between the interfacing models for each group of interfacing models.

In accordance with an embodiment and any of the preceding embodiments, the method and system also include receiving the plurality of models making-up the system, wherein each of the plurality of models includes a low-level model that represents a certain function, part of a function, or a group of functions that the system is configured to perform.

In accordance with an embodiment and any of the preceding embodiments, the method and system also include receiving the plurality of models making up the system, wherein each of the plurality of models includes a low-level model defining a requirement, part of a requirement, or a group of requirements that the system is configured to satisfy.

In accordance with an embodiment and any of the preceding embodiments, each model includes a certain logic circuit that defines a requirement that the system is configured to satisfy.

In accordance with an embodiment and any of the preceding embodiments, each model is configured to generate one or more expected outputs in response to one or more inputs based on the certain logic circuit associated with a particular model.

In accordance with an embodiment and any of the preceding embodiments, the method and system additionally include generating a unit test harness for each model of the plurality of models making-up the system.

In accordance with an embodiment and any of the preceding embodiments, the method and system additionally include generating a unit test case for the unit test harness for each model, wherein the automatically running the unit test for each model includes using the unit test case for each model.

In accordance with an embodiment and any of the preceding embodiments, wherein generating the unit test harness for each model includes separating a particular model from an environment of the particular model so that the particular model is independent from other models of other system requirements that provide inputs to the particular model.

In accordance with an embodiment and any of the preceding embodiments, wherein automatically running the unit test for each model includes generating an expected output value for each of one or more outputs of each model in response to an input value for each of one or more inputs of each model for all combinations of possible different input values for each model.

In accordance with an embodiment and any of the preceding embodiments, the method and system further include automatically generating a table for each model independent from other models in response to running the unit test for each model. The table for a particular model includes the expected output value for each of the one or more outputs associated respectively with the input value for each of the one or more inputs for each combination of possible different input values for the particular model.

In accordance with an embodiment and any of the preceding embodiments, the method and system also include automatically generating an integration test harness for each group of interfacing models; and automatically generating an integration test case for each group of interfacing models for each integration test harness, wherein automatically running the integration test for each group of interfacing models includes using the integration test case for each group of interfacing models.

In accordance with an embodiment and any of the preceding embodiments, wherein automatically running the integration test for each group of interfacing models includes automatically generating a table for each group of interfacing models. The table for a particular group of interfacing models includes an expected output value for each of one or more outputs of the particular group of interfacing models associated with an input value for each of one or more inputs of the particular group of interfacing models for each combination of possible different input values of the particular group of interfacing models. The table is used to detect at least one of inconsistent, incomplete or incorrect data between the interfacing models of a particular group of interfacing models.

The features, functions, and advantages that have been discussed can be achieved independently in various embodiments or may be combined in yet other embodiments further details of which can be seen with reference to the following description and drawings.

DETAILED DESCRIPTION

Figure 1A:
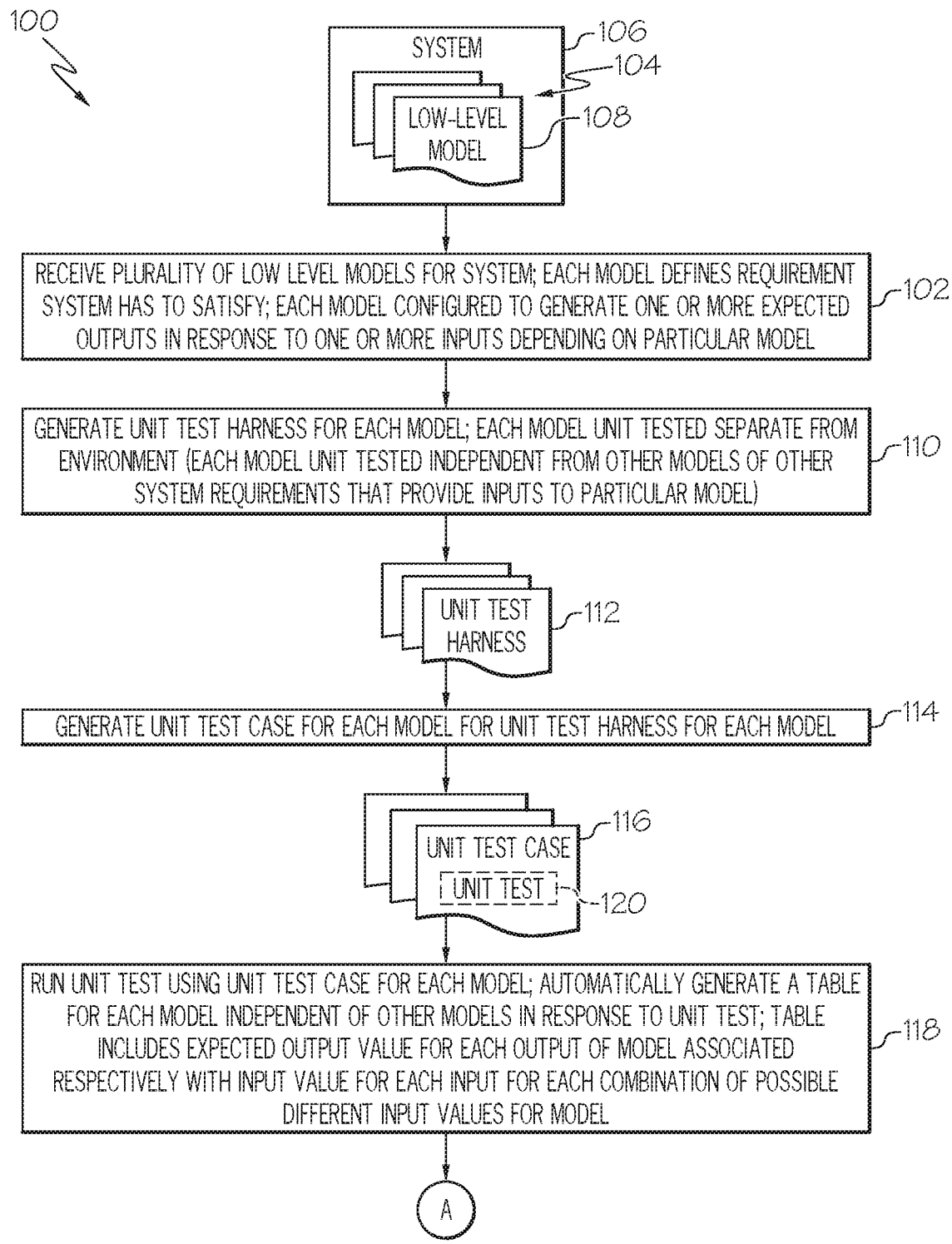
FIGS. 1A and 1B are a flow chart of an example of a method for automatic generation of integration tests from unit tests in accordance with an embodiment of the present disclosure.

The following detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Figure 1B:
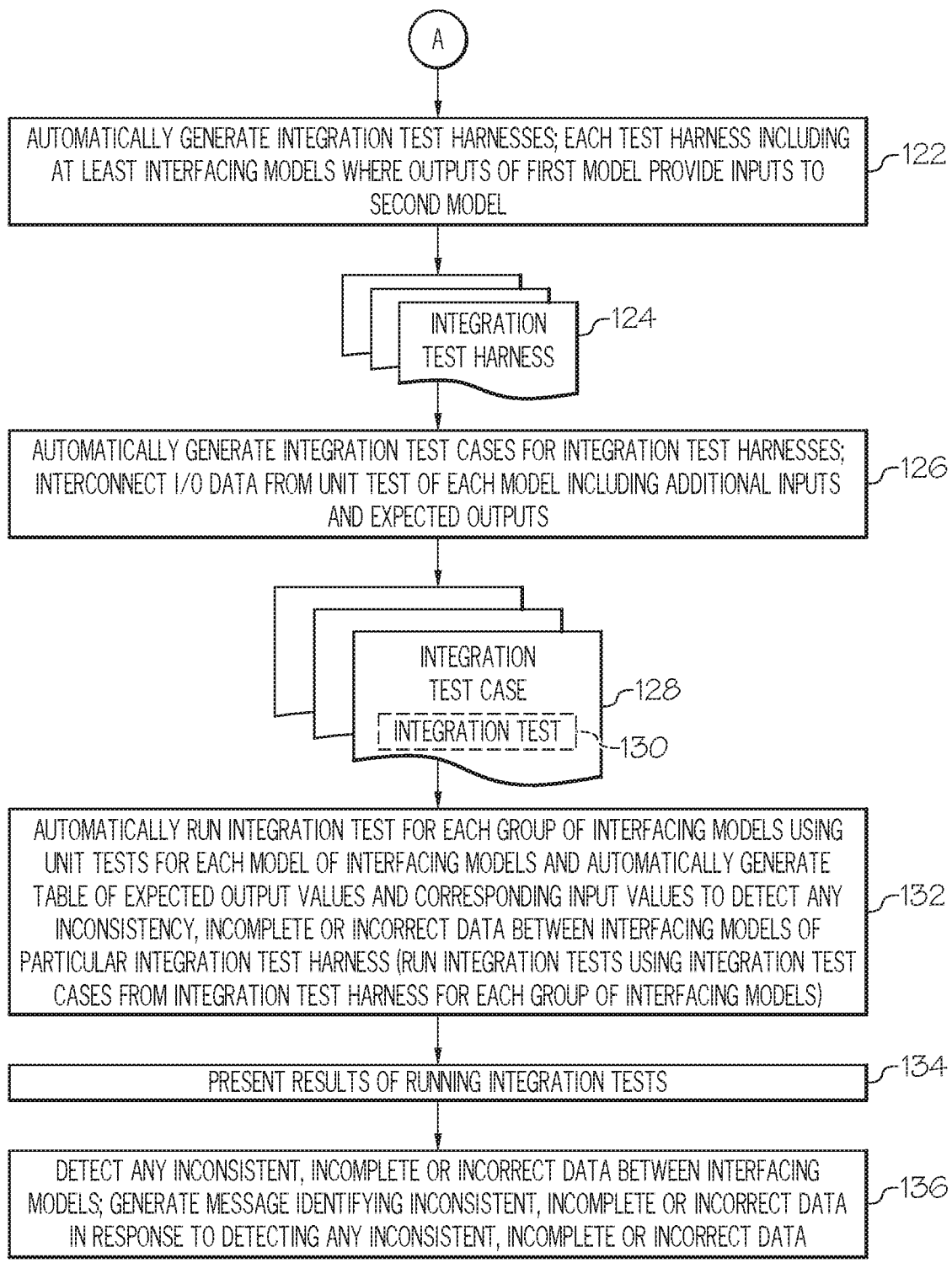

FIGS. 1A and 1B are a flow chart of an example of a method 100 for automatic generation of integration tests from unit tests in accordance with an embodiment of the present disclosure. In block 102, a plurality of models 104 making-up a system 106 are received. The system 106 is any type of system. In accordance with an example, the system 106 is a system or portion of a system of an aircraft, such as for example, a flight control system, engine control system, navigation system, communications system, landing gear system, etc.

In accordance with an example, each of the plurality of models 104 includes a low-level model 108 that represents a certain function, part of a function, or a group of functions that the system 106 is configured to perform. In accordance with an embodiment, each model 104 includes a certain logic circuit 202, 206 (FIG. 2) that defines a requirement that the system 106 is configured to satisfy. In accordance with an example, each of the plurality of models 104 includes a low-level model 104 defining a requirement, part of a requirement, or a group of requirements that the system 106 is configured to satisfy.

Figure 2:
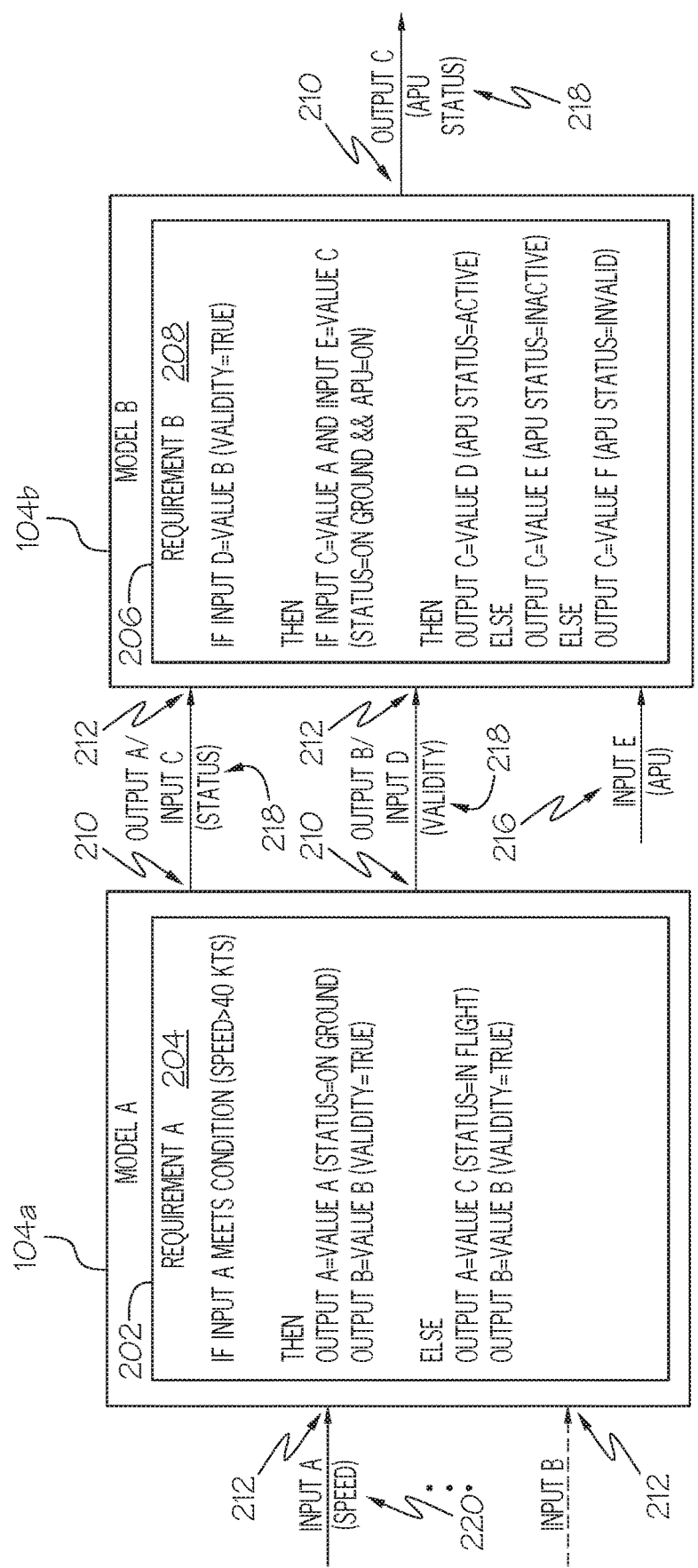
FIG. 2 is an illustration of an example of interfacing models of a system in accordance with an embodiment of the present disclosure.

Referring also to FIG. 2, FIG. 2 is an illustration of an example of interfacing models 104, model A 104a and model B 104b of the system 106, in accordance with an embodiment of the present disclosure. Model A 104a includes a logic circuit 202 that defines requirement A 204. Model B 104b includes a logic circuit 206 that defines requirement B 208. Each model 104 is configured to generate one or more expected outputs 210 in response to one or more inputs 212 based on the certain logic circuit 202 or 206 associated with a particular model 104a or 104b. In accordance with an example, the certain logic circuits 202 and 206 are each embodied in hardware, software or a combination of hardware and software that generates the one or more expected outputs 210 in response to the one or more inputs 212. As illustrated in the example in FIG. 2, the outputs 210 of model A 104a are the inputs 212 for model B 104b. Model B 104b also includes an external input, input E 216 that is from another source (not shown in FIG. 2) and is not an output from model A 104a. Similarly, output C 210 from model B 104b may be an input to another model 104 of the system 106.

Figure 3A:
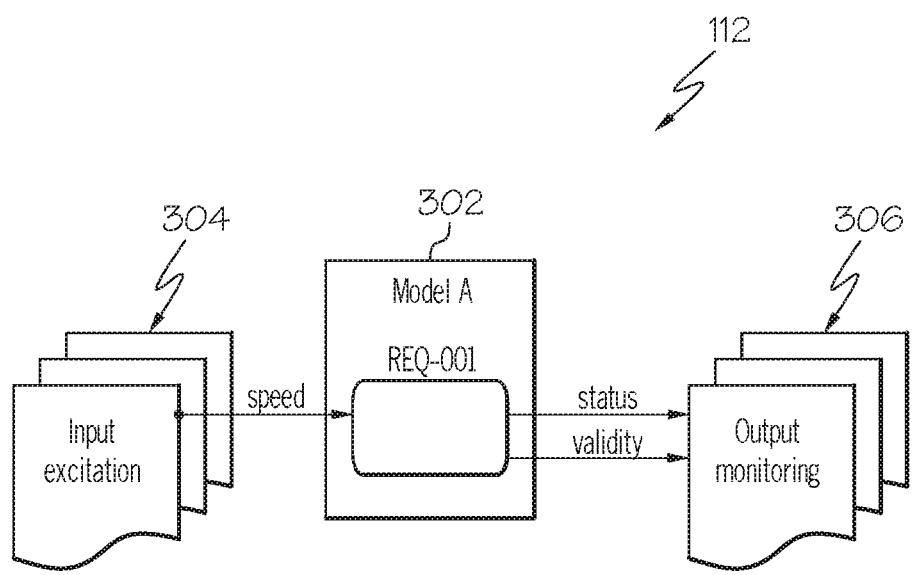
FIG. 3A is an example of a test harness for model A in FIG. 2 in accordance with an embodiment of the present disclosure.

Referring back to FIG. 1A, in block 110, a unit test harness 112 is generated for each model 104 of the plurality of models 104 making-up the system 106. The unit test harness 112 is either manually or automatically generated. In accordance with an embodiment, the unit test harness 112 is manually generated by a user implementing a computer pointing device to designate a particular model 104 of the plurality of models 104. Referring also to FIG. 3A, FIG. 3A is an example of a unit test harness 112 for model A 104a in FIG. 2 in accordance with an embodiment of the present disclosure. The main function of a test harness, such as unit test harness 112, is to isolate the model 104 (or models) within what can be seen as a black-box model 302, in which you don't see the inside, i.e. you do not worry about what are the logics inside. In addition, the unit test harness 112 also defines a set of inputs 304 to feed the black-box model 302 according to a particular model's external interfaces. The black-box model 302 also deals with evaluation of the outputs 306 that the particular model 104 provides according to the inputs 304 given. The evaluation of what the outputs 306 are can be done by different means, but in any case, it will be later when running the unit test 120 (if the black-box model 302 contains only one model) or the integration test 130 (if the black-box model 302 contains more than one model) when the outputs 306 from the black-box model 302 are compared with the outputs 210 that are expected. If the outputs 306 from the black-box model 302 match with the expected outputs 210, the unit/integration tests 120/130 have succeeded. If not, the unit/integration tests 120/130 have failed.

Figure 4A:
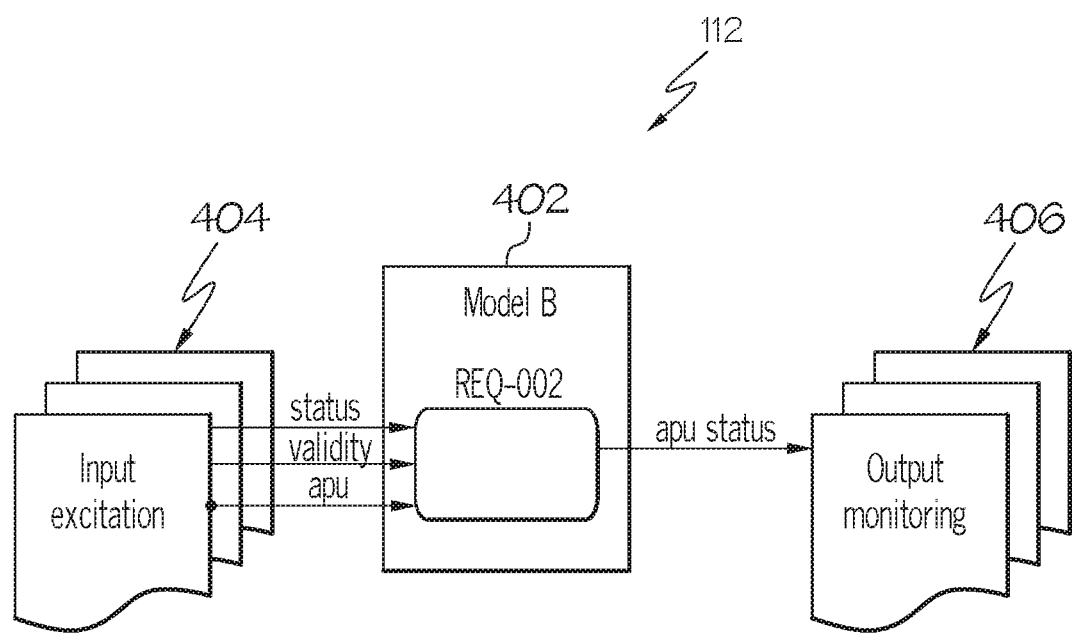
FIG. 4A is an example of a test harness for model B in FIG. 2 in accordance with an embodiment of the present disclosure.

Referring also to FIG. 4A, FIG. 4A is an example of a unit test harness 112 for model B 104b in FIG. 2 in accordance with an embodiment of the present disclosure. The unit test harness 112 also defines a set of inputs 404 to feed the black-box model 402 according to the particular model's external interfaces. The black-box model 402 evaluated the outputs 406 that the model 402 provides based on the inputs 404.

Accordingly, generating the unit test harness 112 includes separating a particular model 104 from an environment of the particular model 104 in the system 106. Each model 104 is unit tested separate from the model's environment in the system 106. That is, each particular model 104 is unit tested independent from other models 104 of other system requirements 204 and 208 that provide inputs 212 to the particular model 104.

In block 114, a unit test case 116 is generated from the unit test harness 112 for each model 104. Referring also to FIG.

Figure 3B:
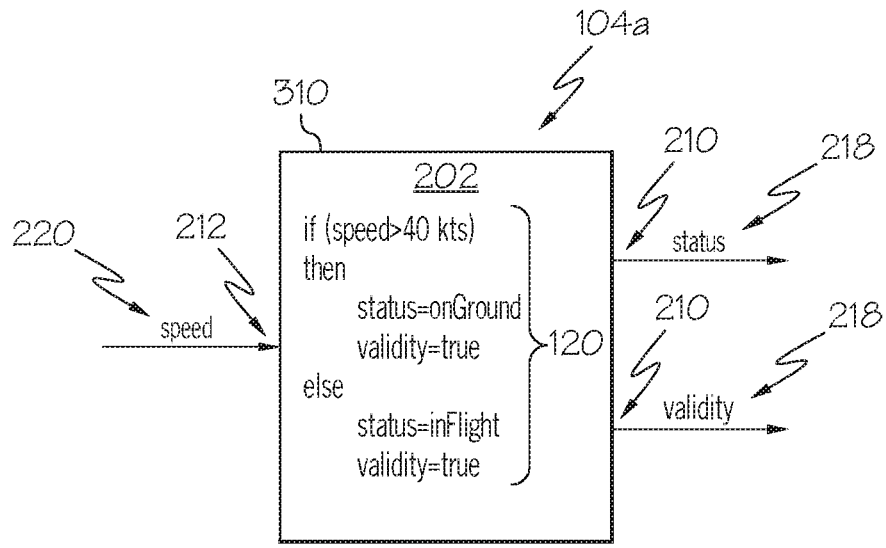
FIG. 3B is an example of a unit level model of model A in FIG. 2 in accordance with an embodiment of the present disclosure.

3B, FIG. 3B is an example of a unit level model 310 of model A 104a in FIG. 2 in accordance with an embodiment of the present disclosure.

In block 118, a unit test 120 is automatically run for each model 104 of the plurality of models 104 making-up the system 106. Automatically running the unit test 120 for each model 104 includes using the unit test case 116 for each model 104. The unit test 120 is embodied in the unit test case 116. Automatically running the unit test 120 for each model 104 includes getting the output values 218 (FIGS. 2 and 3B) for each of one or more outputs 210 of each model 104 in response to an input value 220 for each of one or more inputs 212 of each model 104 for all combinations of possible different input values 220 for each model 104. As illustrated in FIG. 3B, the unit test 120 is run by applying different possible input values 220 to the unit level model 310 of model A 104a. The expected output values 218 are generated based on the logic circuit 202 of the unit level model 310 implementation.

Figure 3C:
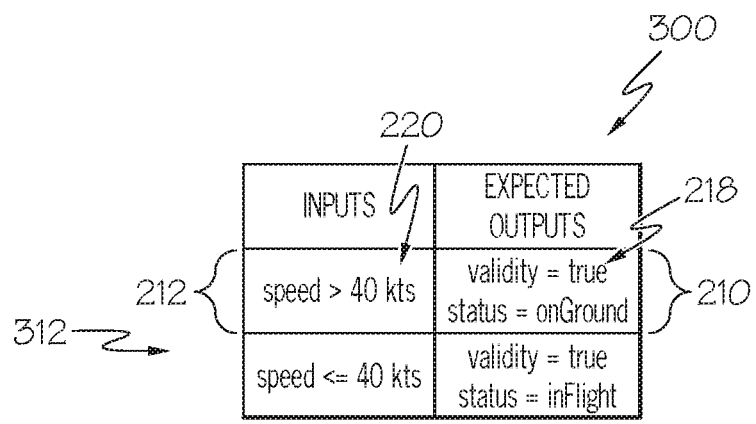
FIG. 3C is an example of a set of unit test cases of model A in accordance with an embodiment of the present disclosure.

Also, in block 118, a table, for example table 300 in FIG. 3C, is generated for each model 104 independent from other models 104 as a set of unit test cases 312 for each model 104. Referring also to FIG. 3C, FIG. 3C is an example of a set of unit test cases 312 of model A 104a in accordance with an embodiment of the present disclosure. FIG. 3C depicts an example of a table 300 generated by the unit test case 116 of model A 104a in accordance with an embodiment of the present disclosure. The table 300 for a particular model 104, such as model A 104a in the example in FIG. 3B, includes the expected output value 218 for each of the one or more outputs 210 associated respectively with the input value 220 for each of the one or more inputs 212 for each combination of possible different input values 220 for the particular model 104.

Figures 4B, 4C:
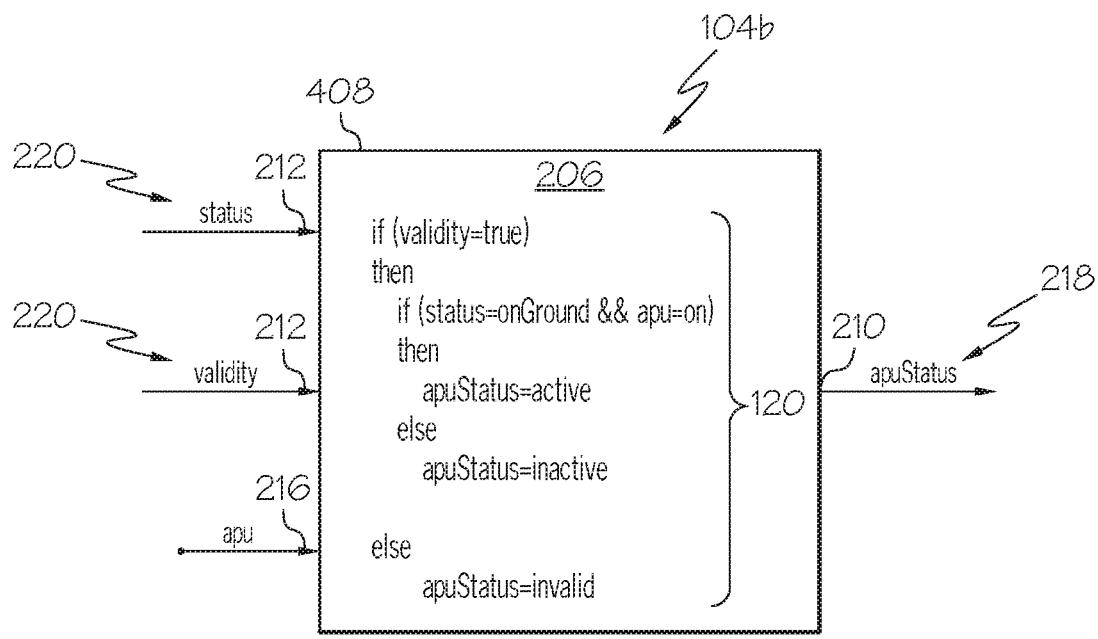
FIG. 4B is an example of a unit level model of model B in FIG. 2 in accordance with an embodiment of the present disclosure.
FIG. 4C is an example of a set of unit test cases of model B in accordance with an embodiment of the present disclosure.

Referring also to FIG. 4B, FIG. 4B is an example of a unit level model 408 of model B 104b in FIG. 2 in accordance with an embodiment of the present disclosure. As previously described, a unit test 120 is automatically run for each model 104. An expected output value 218 is obtained for each of one or more outputs 210 for model B 104b in response to an input value 220 for each of one or more inputs 212 of model B 104b for all combinations of possible different input values 220 for model B 104b. In accordance with the example illustrated in FIG. 4B, model B 104b has an external input 216 that is from another source other than an output 210 from model A 104a (FIGS. 2 and 3B). As illustrated in FIG. 4B, the unit test 120 embodied in the unit test case 116 is run by applying different possible input values 220 to the unit test case 116 of Model B 104b. The expected output values 218 are generated based on the logic circuit 206 of the unit level model 408 implementation of Model B 104b.

Referring also to FIG. 4C, FIG. 4C is an example of a set of unit test cases 410 of model B 104b in accordance with an embodiment of the present disclosure. FIG. 4C depicts an example of a table 400 generated as a set of unit test cases 410 of model B 104b in accordance with the example illustrated in FIG. 4B. The table 400 for model B 104b includes an expected output value 218 for each of the one or more outputs 210 associated respectively with the input value 220 for each of the one or more inputs 212 and 216 for each combination of possible different input values 220 for model B 104b in the example of FIGS. 4B and 4C.

Figure 5A:
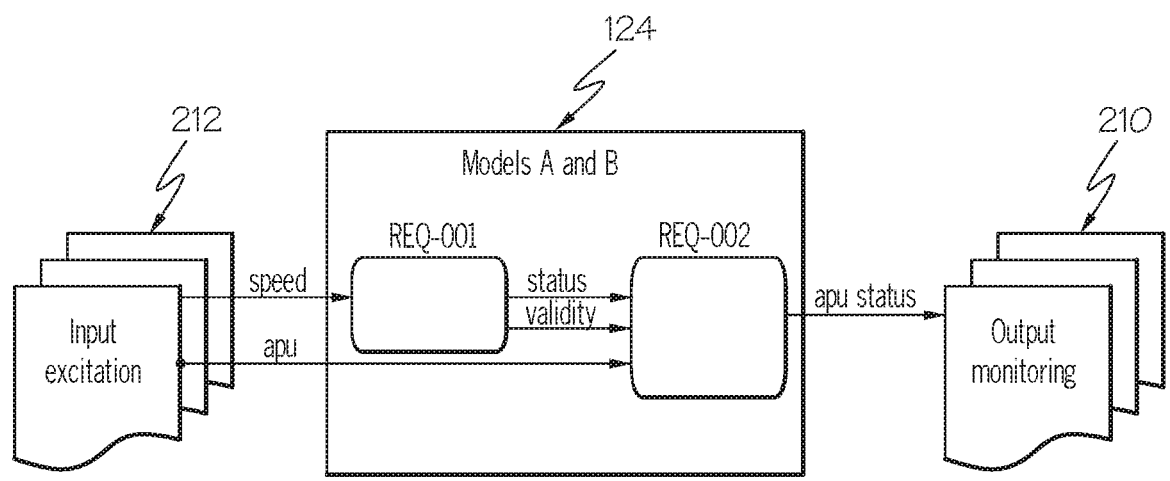
FIG. 5A is an example of an integration test harness for models A and B in accordance with an embodiment of the present disclosure.

In block 122, an integration test harness 124 is automatically generated for one or more groups of interfacing models 104 of the plurality of models 104. Referring also to FIG. 5A, FIG. 5A is an example of an integration test harness 124 for models A and B 104a and 104b in FIG. 2 in accordance with an embodiment of the present disclosure. In FIG. 2, model A 104a and model B 104b illustrate a group of interfacing models 104. Integration of the interfacing models 102a and 104b is determined by the outputs 210 of model A 104a corresponding to the inputs 212 of model B 104b. In other examples more than two models 104 form a group of interfacing models 104. The integration test harness 124 is either manually or automatically generated. Similar to that previously described, the integration test harness 124 is automatically generated by determining which models 104 have one or more outputs 210 that are provided as one or more inputs 212 to one or more other models 104 of the system 106. In accordance with another embodiment, the integration test harness 124 is generated manually by a user implementing a computer pointing device to select each group of interfacing models 104.

Figure 5B:
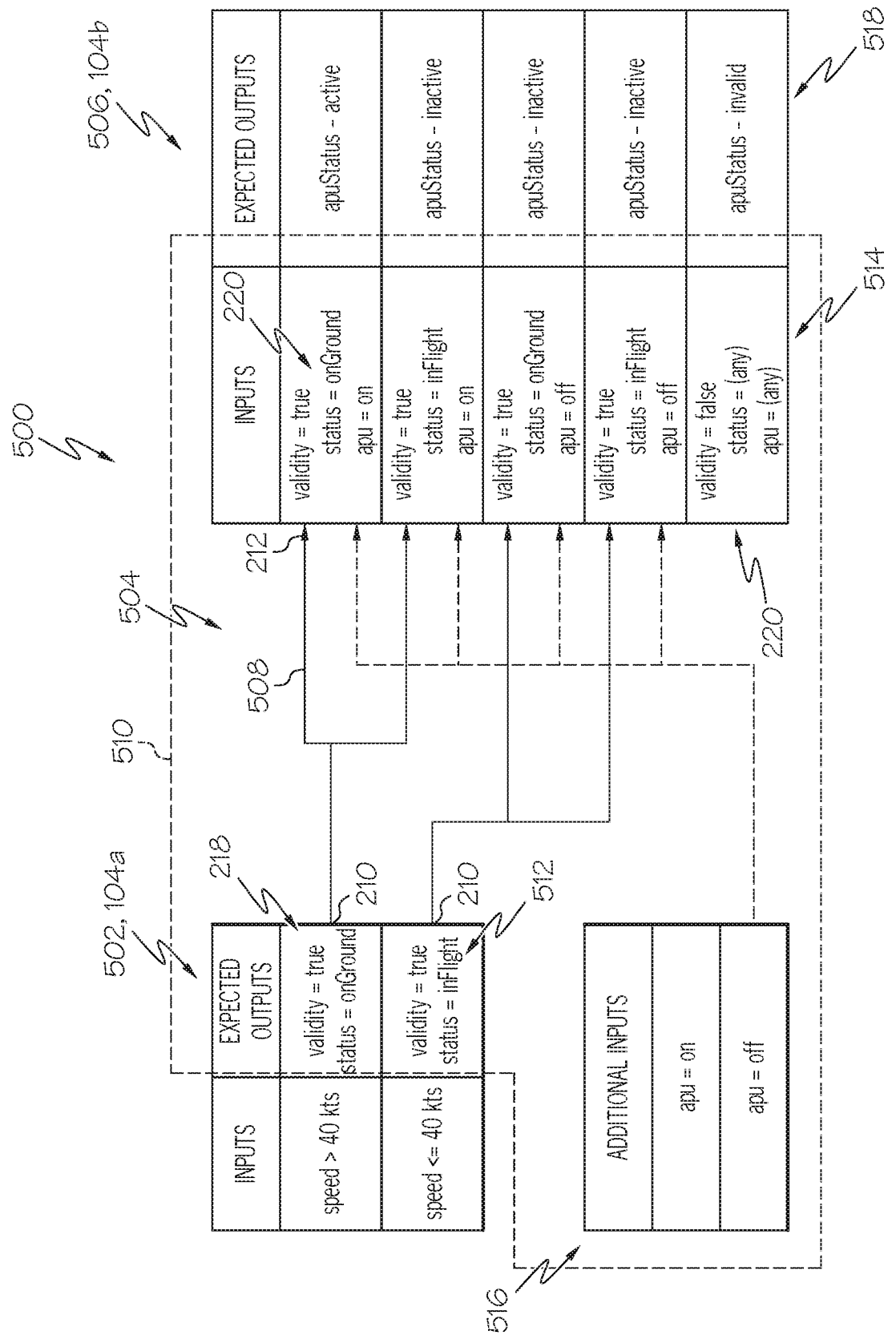
FIG. 5B is an example of how the method performs automatically to generate an integration test case from an integration test harness that integrates models A and B according to how they interface with each other in FIG. 2, once they have individually passed their respective unit tests, in accordance with an embodiment of the present disclosure.

In block 126, an integration test case 128 is automatically generated for each group of interfacing models 104. Automatically generating the integration test case 128 for each group of interfacing models 104 includes interconnecting input/output (I/O) data from the unit tests 120 of each model 104 in a particular group of interfacing models 104 similar to that illustrated in the example in FIG. 5B. FIG. 5B is an example of how the method 100 performs automatically to generate an integration test case 128 from an integration test harness 124 (FIG. 5A) that integrates model A 104a and model B 104b once the models 104 have individually passed their respective unit tests 120. Different expected output values 218 of one or more outputs 210 of a first model 502, for example model A 104a, are correlated 504 to one or more inputs 212 of a second model 506, for example model B 104b. The output values 218 of the first model 502 (model A 104a) and corresponding input values 220 of the second model 506 (model B 104b) are embodied in signals 508 in the interface 510 between the models 502 and 506. The signals 508 are analyzed in terms of data type, dimension, range, units and any other parameters that are needed to detect any inconsistent, incomplete or incorrect data from the integration testing of the interfacing models 502/104a and 506/104b. In the example in FIG. 5B, the output data 512 from the unit test 120 of model A 104a is interconnected as the input data 514 from the unit test 120 of model B 104b along with the additional inputs 516 to provide the expected outputs 518 from the integration tests 130. The integration tests 130 are embodied in and defined by the integration test cases 128.

Figure 6:
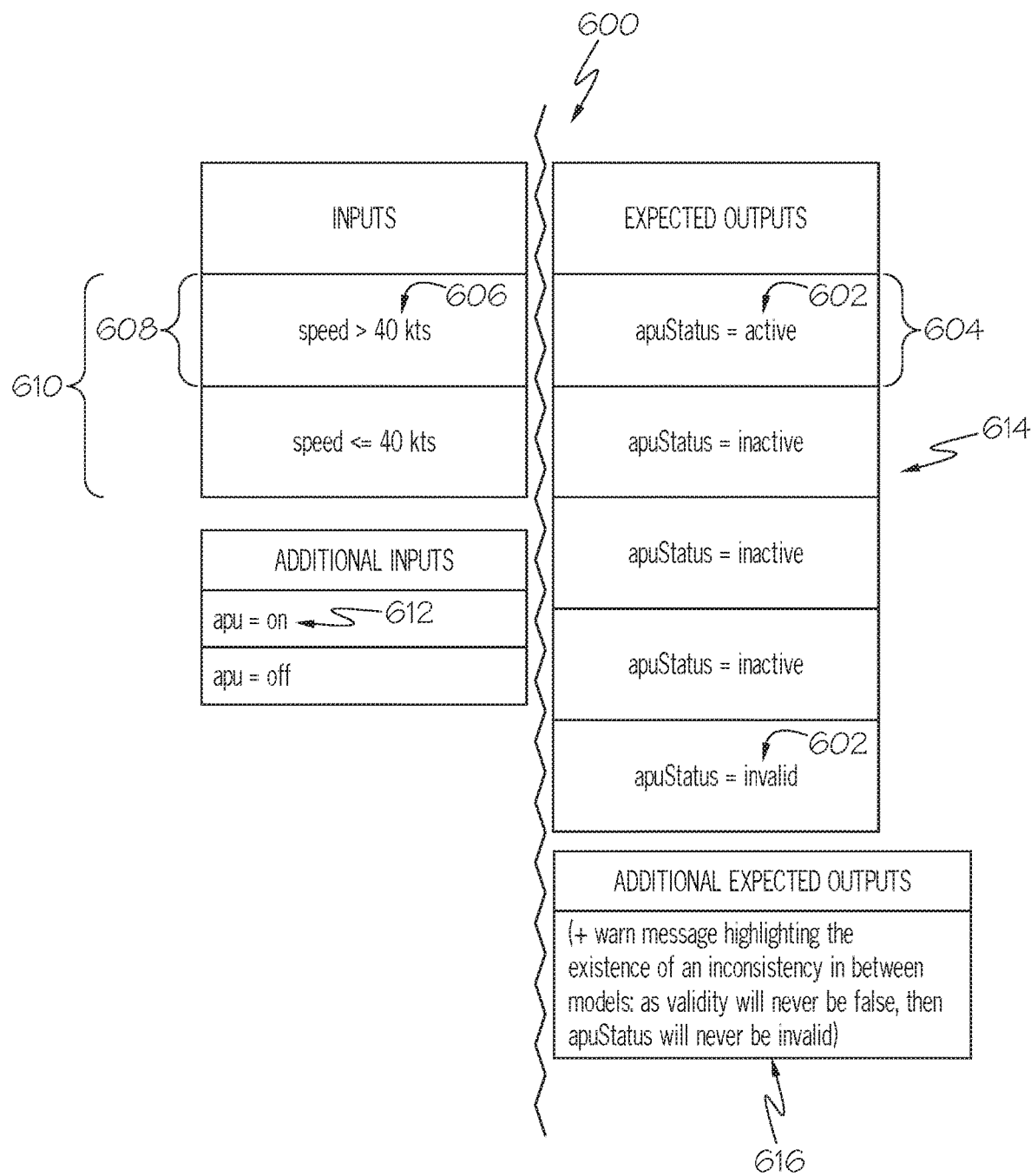
FIG. 6 is an example of how the automatically generated integration test case of unit models A and B (FIG. 2) looks like, in accordance with an embodiment of the present disclosure.

In block 132, an integration test 130 is automatically run for each group of interfacing models 104 from the unit tests 120 for each model 104 of the interfacing models 104. Automatically running the integration test 130 for each group of interfacing models 104 includes automatically generating a table 600 (FIG. 6) for each group of interfacing models 104 from the unit tests 120 for each model 104. Referring also to FIG. 6, FIG. 6 is an example of how the automatically generated integration test case 128 of unit models A and B 104a and 104b (FIG. 2) looks like, in accordance with an embodiment of the present disclosure. A table 600 is generated by the integration test case 128 for the example illustrated in FIG. 5B. The table 600 for a particular group of interfacing models 104, such as model A 104a and model B 104b of the example described herein, includes an expected output value 602 for each of one or more outputs 604 associated with an input value 606 for each of one or more inputs 608 of the particular group of interfacing models 104. An expected output value 602 for each output 604 is determined for each combination 610 of possible different input values 606 of the particular group of interfacing models 104 from the unit tests 120 of the interfacing models 104. In the example illustrated in FIG. 6, the table 600 includes additional possible input values 612 from a source other than a first model 502 (FIG. 5B) of the interfacing models 502 and 506 in FIG. 5 or 104a and 104b in FIG. 2 of the examples described herein. The table 600 is used to detect at least one of inconsistent, incomplete and incorrect data between the interfacing models 502 and 506 or 104a and 104b of a particular group of interfacing models 104. In the example illustrated in FIGS. 5B and 6, the input value 220 for "validity" will never be "false" (FIG. 5B). Therefore, the expected output value 602 for "apuStatus" will never be "invalid" (FIG. 6). This represents an inconsistent, incomplete or incorrect data.

As previously discussed, the integration tests 130 are automatically run from the unit tests for each model 104. Referring again to FIGS. 3C, 4C and 5B, the input values 606 in FIG. 6 for each of the one or more inputs 608 in table 600 correspond to the input values 220 of the one or more inputs 212 in table 300 (FIG. 3C) generated from the unit test 120 for model A 104a. Similarly, the output values 602 for each of the one or more outputs 604 in table 600 correspond to the output values 218 of the one or more outputs 210 in the table 400 (FIG. 4C) generated from the unit test 120 for model B 104b which interfaces with model A 104a in the exemplary integration test case 128 illustrated in FIG. 5B.

In block 134, results 614 of running the integration tests 130 for each of the groups of interfacing models 502 and 506 or 104a and 104b are presented. In accordance with an example, the results 614 are presented similar to that illustrated in FIG. 6.

In block 136, any inconsistent, incomplete or incorrect data transmitted between the interfacing models 502 and 506 or 104a and 104b or generated by any of the models 104 is automatically detected for each group of interfacing models 104. In an example, a message 616 is generated identifying the inconsistent, incomplete or incorrect data in response to the inconsistent, incomplete or incorrect data being detected.

Figure 7:
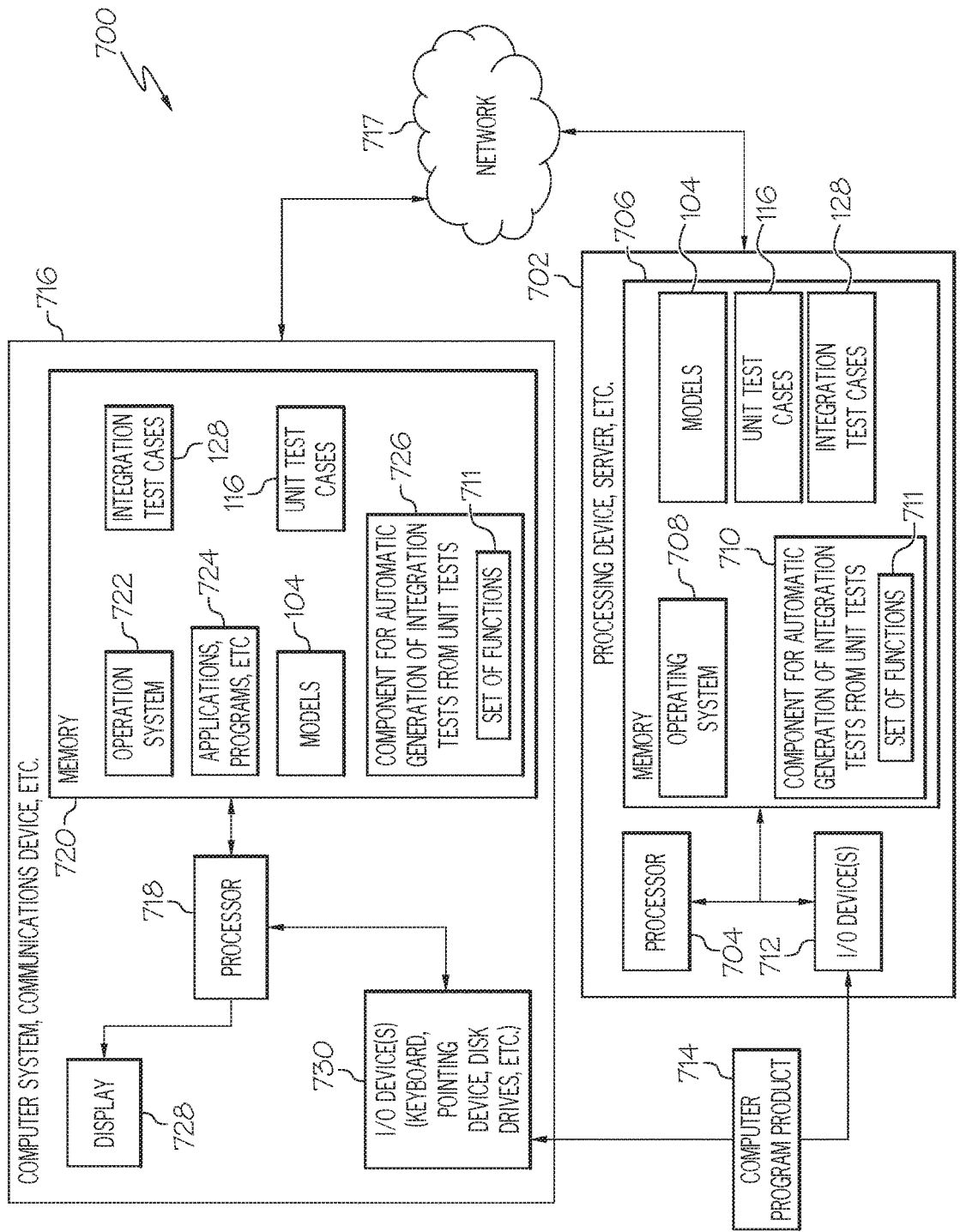
FIG. 7 is an example of a system for automatic generation of integration tests using unit tests in accordance with an embodiment of the present disclosure.

FIG. 7 is an example of a system 700 for automatic generation of integration tests from unit tests in accordance with an embodiment of the present disclosure. In accordance with an embodiment, the method 100 of FIGS. 1A-1B is embodied in and performed by the system 700. However, any system capable of performing the operations described herein may be used. The system 700 includes a processing device 702. In accordance with an example, the processing device 702 is a server. The processing device 702 includes a processor circuit 704 for controlling operation of the processing device 702 and for performing functions, such as those described herein with respect to the method 100 in FIGS. 1A-1B. The processing device 702 also includes a memory 706. An example of the memory 706 is any type of data storage device. An operating system 708, applications and other programs are stored on the memory 706 for operating on the processor circuit 704. In accordance with an embodiment, a plurality of models making up a system, such as for example, models 104 are stored on the memory 706. The memory 706 also includes a component 710 for automatic generation of integration tests from unit tests as described herein. In accordance with an example, the method 100 is at least partially embodied in the component 710 for performing a set of functions 711 described with reference to FIGS. 1A-1B. In the example of FIG. 7, unit test cases 116 and integration test cases 128 are also stored on the memory 706. In other embodiments, the unit test cases 116 and integration test cases 128 are stored on another device or devices.

In accordance with an example, the processing device 702 also includes one or more input devices, output devices or combination input/output devices, collectively I/O devices 712. Examples of the I/O devices 712 include, but are not necessarily limited to, a keyboard or keypad, pointing device, such as a mouse, disk drive and any other devices to permit a user to interface with and control operation of the processing device 702 and to access and run the component 710 for automatic generation of integration tests 130 from unit tests 120. In an example, one of the I/O devices 712 is a device to read a computer program product, such as computer program product 714. The computer program product 714 may be similar to that described in more detail herein. The component 710 and models 104 may be loaded on the memory 706 from a computer program product, such as computer program product 714.

In accordance with an example, the system 700 also includes computer system 716 to access the processing device 702 and the component 710 for automatic generation of integration tests 130 from unit tests 120. The computer system 716 accesses the processing device 702 and the component 710 for automatic generation of integration test from unit tests via a network 717. Examples of the computer system 716 include but are not necessarily limited any sort of electronic device, communications device including a mobile communications device. Examples of the network 717 include but are not limited to the Internet, an intranet or other private or proprietary network.

The computer system 716 includes a processor circuit 718 to control operation of the computer system 716 and a memory 720. The memory 720 includes any type of data storage device. An operating system 722, applications 724 and other programs are stored on the memory 720 for running on the processor circuit 718. In accordance with an embodiment, a component 726 for automatic generation of integration tests 130 from unit tests 120 is stored on the memory 720. The method 100 in FIGS. 1A-1B or at least portions of the method 100 are compiled and run on the processor circuit 718 to perform the functions similar to those described with respect to the method 100 in FIGS. 1A-1B.

In accordance with an embodiment, the component 726 for automatic generation of integration tests 130 from unit tests 120 operating on the computer system 716 interfaces and/or operates in conjunction with the component 710 for automatic generation of integration tests 130 from unit tests 120 operating on the processing device 702 to perform the functions and operations described herein. Accordingly, the component 726 operating on the computer system 716 performs some of the set of functions 711 and operations of the method 100 and the component 710 operating on the processing device 702 perform other functions of the method 100. Some embodiments of the present disclosure include only the component 710 for automatic generation of integration tests 130 from unit tests 120 on the processing device 702, and other embodiments include only the component 726 for automatic generation of integration tests 130 from unit tests 120 operating on the computer system 716.

In accordance with an embodiment, models, such as models 104, unit test cases 116 and integration test cases 128 are stored on only one of memory 720 of the computer system 716 or memory 706 of the processing device 702. In other embodiments the models 104, unit test cases 116 and integration test cases 128 are stored on both memories 706 and 720. In another embodiment, the models 104, unit test cases 116 and integration test cases are stored on a device other than memory 706 or memory 720.

In accordance with an embodiment, the computer system 716 also include a display 728 and one or more input devices, output devices or combination input/output devices, collectively I/O devices 730. Examples of the I/O devices 730 are the same as I/O devices 712.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of embodiments of the disclosure. As used herein, the singular forms "a", "an" and "the" are intended to include the plural forms as well, unless the context clearly indicates otherwise. It will be further understood that the terms "include," "includes," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to embodiments in the form disclosed. Many modifications and variations will be apparent to those of ordinary skill in the art without departing from the scope and spirit of embodiments.

Although specific embodiments have been illustrated and described herein, those of ordinary skill in the art appreciate that any arrangement which is calculated to achieve the same purpose may be substituted for the specific embodiments shown and that the embodiments have other applications in other environments. This application is intended to cover any adaptations or variations. The following claims are in no way intended to limit the scope of embodiments of the disclosure to the specific embodiments described herein.

What is claimed is:

1. A method for automatic generation of integration tests from unit tests, the method comprising:
automatically running, by a processor circuit, a unit test for each model of a plurality of models making-up a system;
automatically running, by the processor circuit, an integration test for each group of interfacing models of the plurality of models using information on a combination of inputs/outputs and data gathered from the unit tests for each model of the interfacing models wherein automatically running the integration test for each group of interfacing models comprises automatically generating a table for each group of interfacing models, the table for a particular group of interfacing models comprising an expected output value for each of one or more outputs of the particular group of interfacing models associated with an input value for each of one or more inputs of the particular group of interfacing models for each combination of possible different input values of the particular group of interfacing models, the table being used to detect at least one of inconsistent, incomplete or incorrect data between the interfacing models of a particular group of interfacing models; and
automatically detecting, by the processor circuit, at least one of inconsistent, incomplete or incorrect data transmitted between the interfacing models for each group of interfacing models.

2. The method of claim 1, further comprising receiving the plurality of models making-up the system, wherein each of the plurality of models comprises a low-level model that represents a certain function, part of a function, or a group of functions that the system is configured to perform.

3. The method of claim 1, further comprising receiving the plurality of models making up the system, wherein each of the plurality of models comprises a low-level model defining a requirement, part of a requirement, or a group of requirements that the system is configured to satisfy.

4. The method of claim 1, wherein each model comprises a certain logic circuit that defines a requirement that the system is configured to satisfy.

5. The method of claim 4, wherein each model is configured to generate one or more expected outputs in response to one or more inputs based on the certain logic circuit associated with a particular model.

6. The method of claim 1, further comprising generating a unit test harness for each model of the plurality of models making-up the system.

7. The method of claim 6, further comprising generating a unit test case for the unit test harness for each model, wherein the automatically running the unit test for each model comprises using the unit test case for each model.

8. The method of claim 6, wherein generating the unit test harness for each model comprises separating a particular model from an environment of the particular model so that the particular model is independent from other models of other system requirements that provide inputs to the particular model.

9. The method of claim 1, wherein automatically running the unit test for each model comprises generating an expected output value for each of one or more outputs of each model in response to an input value for each of one or more inputs of each model for all combinations of possible different input values for each model.

10. The method of claim 9, further comprising automatically generating a table for each model independent from other models in response to running the unit test for each model, the table for a particular model comprising the expected output value for each of the one or more outputs associated respectively with the input value for each of the one or more inputs for each combination of possible different input values for the particular model.

11. The method of claim 1, further comprising:
automatically generating an integration test harness for each group of interfacing models; and
automatically generating an integration test case for each group of interfacing models for the integration test harness, wherein automatically running the integration test for each group of interfacing models comprises using the integration test case for each group of interfacing models.

12. The method of claim 1, wherein the system is a system or portion of a system of an aircraft.

13. A method for automatic generation of integration tests from unit tests, the method comprising:
receiving, by a processor circuit, a plurality of models making-up a system, wherein each of the plurality of models comprises a low-level model that represents a certain function, part of a function, or group of functions the system is configured to perform;
generating, by the processor circuit, a unit test harness for each model of the plurality of models making-up the system;
generating, by the processor circuit, a unit test case for the unit test harness for each model;
automatically running, by the processor circuit, a unit test for each model using the unit test case for each model;
automatically generating, by the processor circuit, an integration test harness for each group of interfacing models of the plurality of models;
automatically generating, by the processor circuit, an integration test case for each group of interfacing models for the integration test harness;
automatically running, by the processor circuit, an integration test for each group of interfacing models using information on a combination of inputs/outputs and data gathered from the unit tests for each model of the interfacing models; and
automatically detecting, by the processor circuit, at least one of inconsistent, incomplete and incorrect data transmitted between the interfacing models for each group of interfacing models.

14. The method of claim 13, wherein each model comprises a certain logic circuit that defines a requirement, part of a requirement, or a group of requirements that the system is configured to satisfy and wherein each model is configured to generate one or more expected outputs in response to one or more inputs based on the certain logic circuit associated with a particular model.

15. The method of claim 13, wherein automatically running the unit test for each model comprises generating an expected output value for each of one or more outputs of each model in response to an input value for each of one or more inputs of each model for all combinations of possible different input values for each model.

16. The method of claim 15, further comprising automatically generating a table for each model independent from other models in response to running the unit test for each model, the table for a particular model comprising the expected output value for each of the one or more outputs associated respectively with the input value for each of the one or more inputs for each combination of possible different input values for the particular model.

17. The method of claim 13, wherein automatically running the integration test for each group of interfacing models comprises automatically generating a table for each group of interfacing models, the table for a particular group of interfacing models comprising an expected output value for each of one or more outputs of the particular group of interfacing models associated with an input value for each of one or more inputs of the particular group of interfacing models for each combination of possible different input values of the particular group of interfacing models, the table being used to detect at least one of inconsistent, incomplete and incorrect data between the interfacing models of a particular group of interfacing models.

18. A system for automatic generation of integration tests from unit tests, the system comprising:
a processor circuit; and
a memory associated with the processor circuit, the memory comprising computer readable program instructions that, when executed by the processor circuit cause the processor circuit to perform a set of functions comprising:
automatically running a unit test for each model of a plurality of models making-up a system;
automatically running an integration test for each group of interfacing models of the plurality of models using information on a combination of inputs/outputs and data gathered from the unit tests for each model of the interfacing models, wherein automatically running the integration test for each group of interfacing models comprises automatically generating a table for each group of interfacing models, the table for a particular group of interfacing models comprising an expected output value for each of one or more outputs of the particular group of interfacing models associated with an input value for each of one or more inputs of the particular group of interfacing models for each combination of possible different input values of the particular group of interfacing models, the table being used to detect at least one of inconsistent, incomplete and incorrect data between the interfacing models of a particular group of interfacing models; and
automatically detecting at least one of inconsistent, incomplete and incorrect data transmitted between the interfacing models for each group of interfacing models.

19. The system of claim 18, wherein automatically running the unit test for each model comprises generating an expected output value for each of one or more outputs of each model in response to an input value for each of one or more inputs of each model for all combinations of possible different input values for each model, and the set of functions further comprise automatically generating a table for each model independent from other models in response to running the unit test for each model, the table for a particular model comprising the expected output value for each of the one or more outputs associated with the input value for each of the one or more inputs for each combination of possible different input values for the particular model.

20. A method for automatic generation of integration tests from unit tests, the method comprising:
automatically running, by a processor circuit, a unit test for each model of a plurality of models making-up a system, wherein automatically running the unit test for each model comprises generating an expected output value for each of one or more outputs of each model in response to an input value for each of one or more inputs of each model for all combinations of possible different input values for each model;
automatically generating a table for each model independent from other models in response to running the unit test for each model, the table for a particular model comprising the expected output value for each of the one or more outputs associated respectively with the input value for each of the one or more inputs for each combination of possible different input values for the particular model;

automatically running, by the processor circuit, an integration test for each group of interfacing models of the plurality of models using information on a combination of inputs/outputs and data gathered from the unit tests for each model of the interfacing models; and automatically detecting, by the processor circuit, at least one of inconsistent, incomplete or incorrect data transmitted between the interfacing models for each group of interfacing models.

\* \* \* \* \*